United States Patent
Lechner et al.

(10) Patent No.: US 10,359,467 B2
(45) Date of Patent: Jul. 23, 2019

(54) METHOD AND CIRCUIT FOR DETECTING A SHORT CIRCUIT OF A RESOLVER EXCITER LINE TO GROUND OR TO THE OPERATING VOLTAGE

(71) Applicant: Robert Bosch GmbH, Stuttgart (DE)

(72) Inventors: Benjamin Lechner, Neuhausen (DE); Daniel Raichle, Vaihingen (DE); Daniel Zirkel, Wiernsheim-Serres (DE); Michael Ungermann, Darmstadt (DE)

(73) Assignee: Robert Bosch GmbH, Stuttgart (DE)

( * ) Notice: Subject to any disclaimer, the term of this patent is extended or adjusted under 35 U.S.C. 154(b) by 86 days.

(21) Appl. No.: 15/737,485

(22) PCT Filed: Jun. 7, 2016

(86) PCT No.: PCT/EP2016/062839
§ 371 (c)(1),
(2) Date: Dec. 18, 2017

(87) PCT Pub. No.: WO2016/202626
PCT Pub. Date: Dec. 22, 2016

(65) Prior Publication Data
US 2018/0172756 A1    Jun. 21, 2018

(30) Foreign Application Priority Data
Jun. 18, 2015   (DE) ........................ 10 2015 211 214

(51) Int. Cl.
*G01R 31/28*        (2006.01)
*G01D 5/22*         (2006.01)
(Continued)

(52) U.S. Cl.
CPC ........... *G01R 31/2829* (2013.01); *G01D 5/20* (2013.01); *G01D 5/2291* (2013.01); *G01D 18/00* (2013.01); *G01R 31/025* (2013.01)

(58) Field of Classification Search
CPC .... G01R 31/2829; G01R 31/025; G01D 5/20; G01D 5/2291; G01D 18/00
See application file for complete search history.

(56) References Cited

U.S. PATENT DOCUMENTS

| | | | |
|---|---|---|---|
| 2001/0054911 A1* | 12/2001 | Kobayashi | G01R 31/346 324/765.01 |
| 2008/0172202 A1* | 7/2008 | Nakazato | G01D 3/08 702/151 |

(Continued)

FOREIGN PATENT DOCUMENTS

| | | |
|---|---|---|
| DE | 102010007349 | 8/2010 |
| DE | 102011078583 | 1/2013 |

(Continued)

OTHER PUBLICATIONS

International Search Report for Application No. PCT/EP2016/062839 dated Sep. 15, 2016 (English Translation, 3 pages).

*Primary Examiner* — Daniel R Miller
(74) *Attorney, Agent, or Firm* — Michael Best & Friedrich LLP

(57) ABSTRACT

A method for detecting a short circuit (10) of a resolver exciter line (11, 12) comprising the steps of:
measuring (31) the excitation voltage ($U(t_i)$) for the resolver (16) at a number of points in time during each excitation period;
determining (32) the amplitude of the excitation voltage;
starting a diagnostic mode (33) having the following steps (34 bis 37) if the amplitude of the excitation voltage does not reach a first threshold value;
retrieving (34) the time-dependent voltage curves $U_H(t_i)$ of the first and the second exciter line (H; 11) with respect to ground at the number of points in time;
calculating (35) the amplitudes and the offset values of the time-dependent voltage curves;

(Continued)

identifying (36) the exciter line that has a short circuit by determining that the calculated amplitudes do not exceed a second threshold value;
identifying (37) the potential to which the short-circuited line (H or L) can be connected by comparing the offset values to third threshold values.

8 Claims, 2 Drawing Sheets

(51) Int. Cl.
    *G01D 18/00*     (2006.01)
    *G01D 5/20*     (2006.01)
    *G01R 31/02*     (2006.01)

(56) References Cited

U.S. PATENT DOCUMENTS

| | | | |
|---|---|---|---|
| 2013/0049741 A1* | 2/2013 | Kichise | G01D 5/24461 324/207.16 |
| 2014/0142782 A1 | 5/2014 | Fu et al. | |
| 2016/0011267 A1* | 1/2016 | Park | G01D 5/14 702/58 |
| 2016/0161304 A1* | 6/2016 | Son | G01D 3/08 324/207.12 |

FOREIGN PATENT DOCUMENTS

| | | |
|---|---|---|
| EP | 1548411 | 6/2005 |
| EP | 1942315 | 7/2008 |
| EP | 2078933 | 7/2009 |

\* cited by examiner

METHOD AND CIRCUIT FOR DETECTING A SHORT CIRCUIT OF A RESOLVER EXCITER LINE TO GROUND OR TO THE OPERATING VOLTAGE

BACKGROUND OF THE INVENTION

The invention relates to a method for detecting a short in a resolver excitation line to ground or to the operating voltage, and it also comprises a circuit for realizing this method.

Resolvers are used to ascertain the angular position of a rotating object, e.g. the driveshaft of a motor. There are various types of resolver in the prior art. Fundamentally, at least one coil is used in this case to produce a changing magnetic field, and at least one further coil is used to detect this field, the strength of the coupling between the coils varying as a function of the position or angular position to be measured. In the case of the "variable reluctance resolver" (VR resolver), for example, only one field coil is used, and there are two measurement coils that produce position-dependent signals. The German patent application DE 10 2011 078 583 A1 discloses evaluation of resolver sensor signals in a vehicle, for example. To this end, a resolver picks up a rotary movement of a rotor, and a processor element processes the sinusoidal and cosinusoidal output signals of the resolver.

The invention is based on such a resolver, the excitation signal being sinusoidal and typically having a frequency of 10 kHz. The two measurement coils are normally positioned orthogonally in relation to one another and are referred to as the sine and cosine coils. The two measurement signals can be used to explicitly determine the angle of the measurement object.

The excitation signal for the field coil can be provided by two push-pull output stages, for example, one for each of the two connections of the field coil. The output signals of the two output stages then have a phase shift of 180° in relation to one another, and the excitation signal effective for the field coil is the difference voltage between the outputs of the two output stages.

There is, however, also the option of the field coil being operated by only one output stage. The second connection of the field coil is then at a fixed potential, e.g. ground potential, either directly or via a capacitor.

On the receiver coils, there appears an AC voltage signal at the same frequency as the excitation signal, the amplitude of which is modulated in accordance with the rotor position, however, the signal on the cosine coil having a 90° phase shift relative to the signal on the sine coil.

Resolvers are frequency used to regulate permanently excited synchronous machines (PSM) and electrically excited synchronous machines (ESM), which are used e.g. as a drive for hybrid and electric vehicles. Such regulation requires knowledge of the present rotor angular position. Regulation of asynchronous machines (ASM) requires knowledge of the present frequency of the drive.

Their robustness means that resolvers are preferably used for these purposes in motor vehicles, even if there are alternative sensors, e.g. digital angle sensors or sensors based on the eddy current effect.

Sensors in the automotive field need to be diagnosed to meet requirements of functional safety and legislation. In the case of resolvers such as the present application relates to, a possible fault to be diagnosed is a short in a resolver excitation line to ground or to the operating voltage. In this case, a short is subsequently understood to mean only an unwanted electrical connection from one of the connections of the resolver excitation line to ground or to the operating voltage, the diagnosis also being intended to establish which of these potentials has the unwanted connection to it.

In the prior art, such a fault is diagnosed by virtue of the two receiver signals (sine and cosine) no longer being present. Such a diagnosis is inadequate, however, because the absence of the sine and cosine signals can also have other causes, e.g. an open excitation line. The fault cannot be narrowed down further on the basis of the mere signals on the signal lines.

SUMMARY OF THE INVENTION

The method for detecting a short in a resolver excitation line first of all comprises permanently measuring the excitation voltage for the resolver at a multiplicity of times during each excitation period. From this signal profile, the amplitude of the excitation voltage is ascertained, and a diagnosis mode is started if the amplitude does not reach or, in particular, falls short of a first threshold value. In the diagnosis mode, the voltage profile of the two excitation lines is measured individually referenced to ground at a plurality of times during one or more excitation periods, and the amplitudes and the offset values of the two signals are determined from this signal profile. If one of the amplitudes does not exceed a second threshold value or one of the amplitudes falls short of a second threshold value, the associated excitation line is identified as shorted. The potential to which the shorted line is pulled is identified by comparing the associated offset value with third limit values.

Another aspect of the invention consists in a circuit that realizes this method. The circuit is based on the circuit to be examined, which comprises a control apparatus having a processor, power stages and first connections for providing the signals for the excitation lines, and also two AD converters that are connected to second connections of the control device for the signal lines and the outputs of which can be read by the software of the processor and can be evaluated.

In addition, the circuit includes the excitation lines to the field coil of the resolver that are to be diagnosed and the signal lines for the sine and cosine signals, which couple the resolver to the control apparatus. For the diagnosis, the circuit comprises a third AD converter, the inputs of which are connected to the first connections for the excitation lines, a fourth AD converter, the first input of which is connected to one of the first connections for the excitation line and the second input of which is connected to ground, and a fifth AD converter, the first input of which is connected to the other of the first connections for the excitation line and the second input of which is connected to ground. Moreover, the circuit comprises a display and/or memory device for displaying and/or storing the information identified by the processor that incorporates the positive detecting of a short in the excitation lines of the resolver and the denoting of the shorted line and the potential to which this line can be pulled. As an alternative to the fourth and fifth AD converters, two electronic switches can be provided that are inserted into the connection between the connections for the excitation lines and inputs of the third AD converter and disconnect the respective input of the AD converter from the excitation line and temporarily connect it to ground.

The advantage of the invention is that the fault to be diagnosed can be exactly distinguished from other faults (pinpointing diagnosis). The diagnosis is also very fast, since a reliable fault diagnosis is available after only a few periods of the excitation signal with a typical length of 0.1 msec, and suitable measures can be taken if need be. This meets particularly demands on sensors in the automotive field in respect of functional safety and in respect of OBD (On Board Diagnosis) legislation.

An additional advantage is that the method according to the invention can be realized with minimal addition of the standard hardware of resolver actuation.

DETAILED DESCRIPTION

Figure 1:
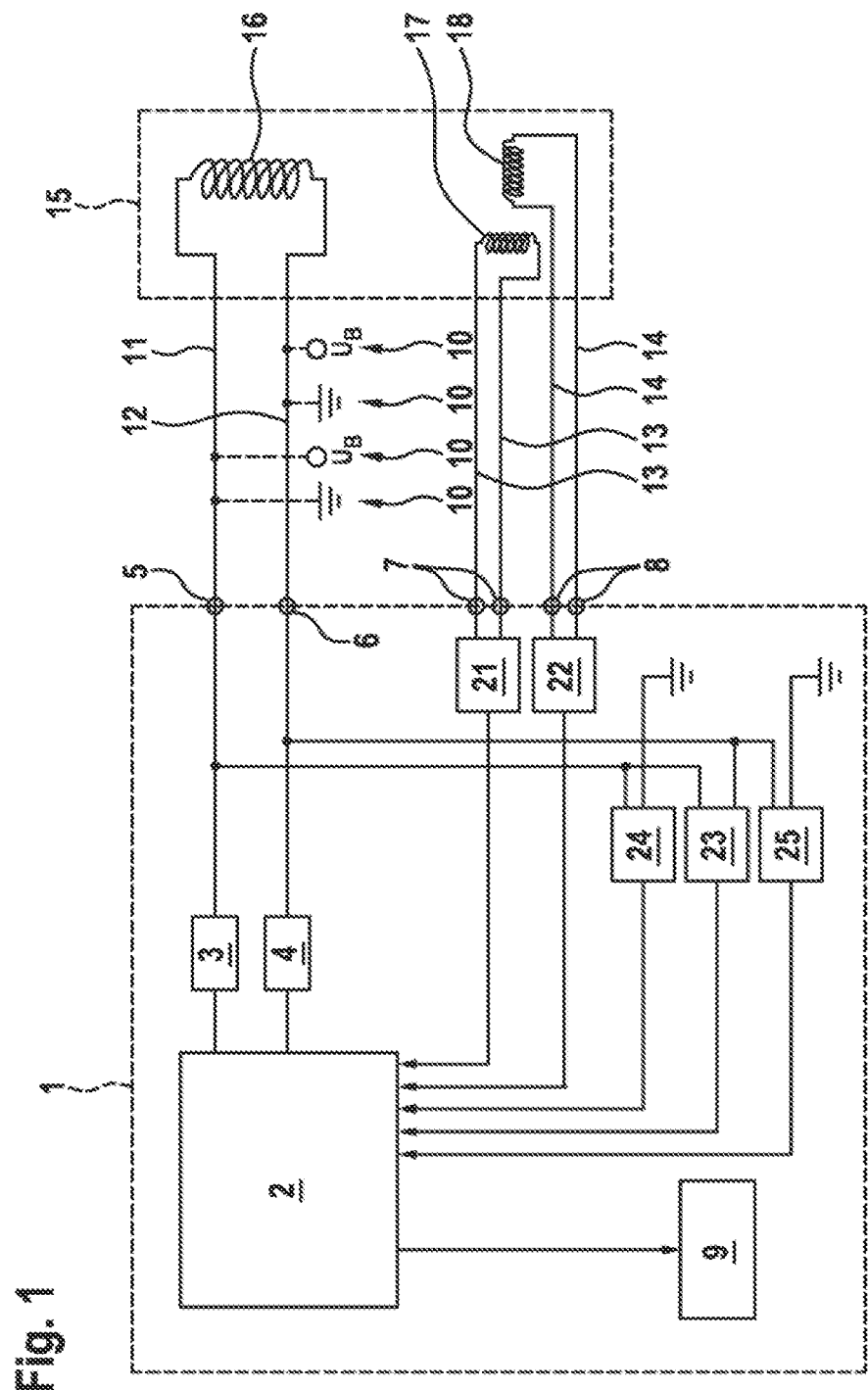
FIG. 1 shows a circuit according to an exemplary embodiment of the invention.

In FIG. 1, the control apparatus 1 for the resolver 15 is in the center, said control apparatus being able to be integrated into the control device for a vehicle (not depicted here). It has a processor 2 (or uses it as well) that monitors the correct operation of all the resolver functions to be controlled and also displays malfunctions if need be.

The control apparatus 1 controls particularly the power stages 3 and 4 for providing the sinusoidal excitation signal for the field coil 16 of the resolver 15 at the first connections 5 and 6. At the second connections 7 and 8, the signals of the sine coil 17 and the cosine coil 18, which represent the instantaneous angular position of the measurement object (e.g. the shaft of the motor), arrive at the control apparatus 1 and, following conversion in the AD converters 21 and 22, can be processed further as a digital signal by software.

The resolver excitation lines 11 and 12 are the connection from the first connections 5 and 6 of the control apparatus 1 to the resolver 15, namely to the field coil 16 thereof. These lines need to be monitored for a short, i.e. an undesirable connection to ground or to the operating voltage $U_B$, as indicated by the potential connections 10, depicted in dotted lines, in FIG. 1. From the sine coil 17 and the cosine coil 18 of the resolver 15, the signal lines 13 and 14 go to the second connections 7 and 8 of the control apparatus 1.

Figure 2:
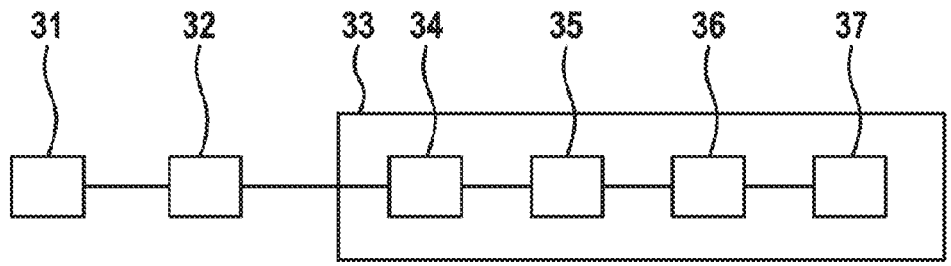
FIG. 2 symbolically explains the method steps for carrying out the method according to an exemplary embodiment of the invention.

For the first step of the diagnosis according to the invention, measuring the excitation voltage (step 31 in FIG. 2), a third AD converter 23 is provided, the inputs of which are connected to the first connections 5 and 6 for the excitation lines 11 and 12. This AD converter 21 is used to constantly measure of the excitation voltage $U(t_i)$ for the resolver 16 at a multiplicity of times $t_i$ during each excitation period. From these data, the processor 2 ascertains the amplitude $U_M$ of the excitation voltage (step 32 in FIG. 2) for the diagnosis. This can be accomplished e.g. by virtue of the maximum $U_{max}$ and the minimum $U_{min}$ of the measured values of the excitation voltage $U(t_i)$ being sought for each excitation period and the amplitude $U_M$ being formed by half the difference between these values $(U_{max}-U_{min})/2$.

Figure 3:
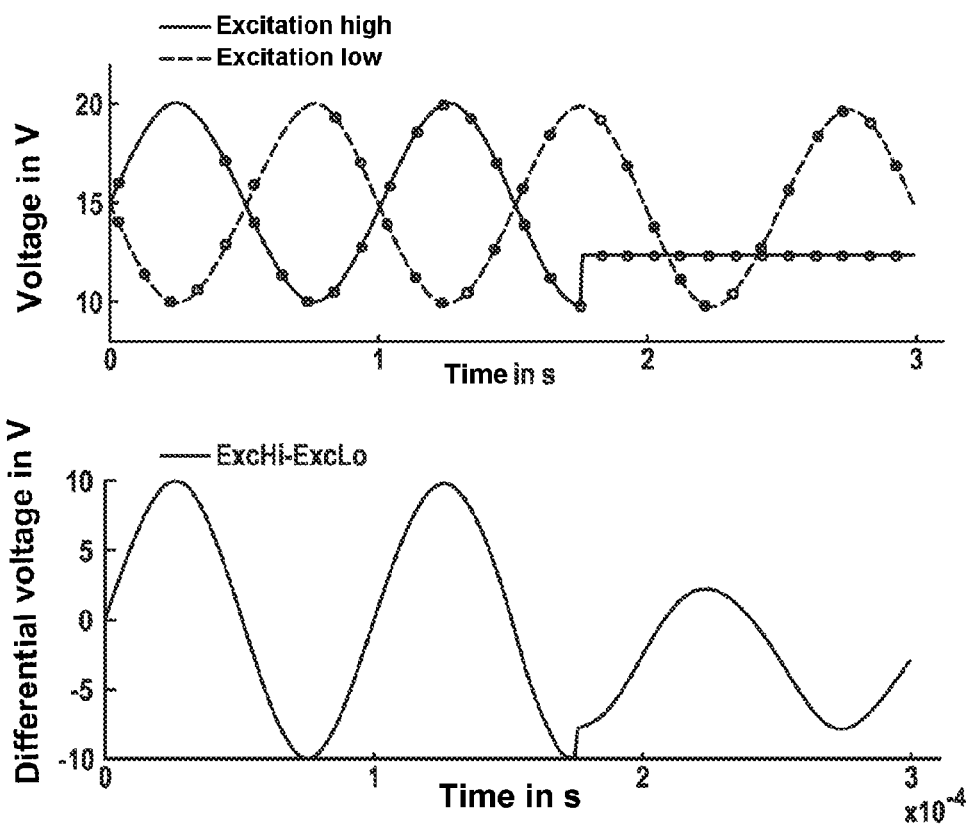
FIG. 3 shows details in the time profile of the potentials on the excitation lines of the resolver when the fault situation occurs.

As FIG. 3 explains, the signal amplitude of the voltage $U(t_i)$ dips when there is a short to be diagnosed (FIG. 3, right), since it is then possible for only one or even none of the power stages 3 and 4 to be driven into the signal amplitude. Therefore, a diagnosis mode 33 can be started if the amplitude $U_M$ of the excitation voltage does not reach a first threshold value $C_{S1}$.

For the diagnosis mode 33, the voltage profile of the individual excitation lines 11 and 12 referenced to ground is evaluated, the index H (or high) subsequently also being used for the line 11 and the index L (or low) being used for the line 12. To this end, the excitation line 11 may be connected to one of the two inputs of a fourth AD converter 24, while its other input is at ground, and the other excitation line 12 is connected to one of the two inputs of a fifth AD converter 25, and also the other input thereof is at ground. The third, fourth and fifth AD converters 23, 24 and 25 are integrated in the control apparatus 1. This embodiment is depicted in FIG. 1.

As an alternative to the AD converters 24 and 25, two electronic switches can be provided (not depicted in FIG. 1) that are inserted into the connection between the connections 5 and 6 for the excitation lines 11, 12 and inputs of the third AD converter 23, the switches being set up such that they respectively disconnect an input of the AD converter 23 from the excitation line 5 or 6 and temporarily connect this input to ground.

In the diagnosis mode 33, the voltage values $U_H(t_i)$ at the connection 5 of the first excitation line (H; 11) referenced to ground and the voltage values $U_L(t_i)$ at the connection 6 of the second excitation line (L; 12) referenced to ground are called up by the processor 2 at a plurality of times $t_i$ during the measurement time of one or more excitation periods (step 34), specifically via the fourth and fifth AD converters 24 and 25, or else alternatively via the third AD converter 23 after temporary transfer of the respective additional switch at the respective other input of the third AD converter 23 to ground during the measurement time.

Using the signals $U_H(t_i)$ and $U_L(t_i)$ thus recorded, the computing 35 of the amplitudes $U_{HA}$ and $U_{LA}$ and of the offset values $U_{HO}$ and $U_{LO}$ is effected by the processor 2, for which there are various options. One of these is to seek the maxima $$\max(U_H(t_i)) \text{ and } \max(U_L(t_i))$$

and the minima $$\min(U_H(t_i)) \text{ and } \min(U_L(t_i))$$

of the signals $U_H(t_i)$ and $U_L(t_i)$, and the amplitudes and offset values are then computed based on the formulae $$U_{HA}=\tfrac{1}{2}*[\max(U_H(t_i))-\min(U_H(t_i))]$$

$$U_{LA}=\tfrac{1}{2}*[\max(U_L(t_i))-\min(U_L(t_i))]$$

$$U_{HO}=\tfrac{1}{2}*[\max(U_H(t_i))+\min(U_H(t_i))] \text{ and}$$

$$U_{LO}=\tfrac{1}{2}*[\max(U_L(t_i))+\min(U_L(t_i))]$$

The line that has a short (H or L) is identified 36 by establishing that the amplitude $U_{HA}$ or $U_{LA}$ does not exceed a second limit value, since a fluctuating signal and hence an amplitude cannot be formed when this line is at a fixed potential. The offset value, that is to say the voltage present on the fourth or fifth AD converter in the event of a fault, indicates the potential at which the short has occurred by virtue of the offset value $U_{HO}$ or $U_{LO}$ being compared with a threshold value $C_{SCG}$ for the ground potential and with a threshold value $C_{SGB}$ for the operating voltage potential, according to the formulae $$U_{HO}<C_{SCG} \text{ (ground potential on line } H)$$

$$U_{HO}>C_{SGB} \text{ (operating voltage potential on line } H)$$

$U_{LO} < C_{SCG}$ (ground potential on line $L$), and $U_{LO} > C_{SGB}$ (operating voltage potential on line $L$).

On the basis of the discovery of which of these four cases applies, the requisite measures can be effected; in particular, the establishment of the fault is displayed or stored using a display and/or memory device 9. The display and/or memory device 9 is used generally for displaying and/or storing information that has been ascertained by the processor 2. The positive detection of a short and the denotation of the shorted line 11 or 12 and of the potential (ground or $U_B$) to which this line is pulled are incorporated into this display. In this case, the shorted line can be denoted e.g. by its color or reference number.

The invention claimed is:

1. A method for detecting a short in a resolver excitation line, the method comprising:
   measuring an excitation voltage of a periodic excitation signal for the resolver across first and second excitation lines of the resolver at a multiplicity of times during each excitation period of the excitation signal;
   ascertaining an amplitude of the excitation voltage based on the measured values of the excitation voltage;
   starting a diagnosis mode having the following steps when the amplitude of the excitation voltage does not reach a first threshold value:
   calling up a time-dependent voltage profile of each of the first and second excitation lines referenced to ground at the multiplicity of times;
   computing an amplitude value and an offset value of each of the time-dependent voltage profiles;
   identifying the excitation line that has a short by determining the time-dependent voltage profile for which the computed amplitude value does not exceed a second limit value; and
   identifying a potential to which the shorted excitation line can be pulled by comparing the offset value of the time-dependent voltage profile of the shorted excitation line with third limit values.

2. The method as claimed in claim 1, wherein the measuring is effected by virtue of a first connection of the first excitation line and a second connection of the second excitation line being connected to respective inputs of an AD converter.

3. The method as claimed in claim 1, wherein the ascertaining of the amplitude of the excitation voltage is effected by virtue of a maximum and a minimum of the measured values of the excitation voltage being ascertained for each excitation period and the amplitude being formed by half the difference between the ascertained maximum and minimum.

4. The method as claimed in claim 1, wherein the calling up of the voltage profile of the first excitation line referenced to ground is effected by virtue of a first input of a first AD converter, to which a first connection of the first excitation line is connected, and a second input thereof being at ground potential at least for a measurement time of the first AD converter,
   and wherein the calling up of the voltage profile of the second excitation line referenced to ground is effected by virtue of a first input of a second AD converter being at ground potential at least for the measurement time of the second AD converter and a second input thereof being connected to a second connection of the second excitation line.

5. The method as claimed in claim 1, wherein the computing of the amplitude value and the offset value of each time-dependent voltage profile is effected by virtue of a maxima and a minima of the time-dependent voltage profile being ascertained, the amplitude value being computed by virtue of the difference between the ascertained maxima and the minima of the time-dependent voltage profile, and the offset value being computed by virtue of the sum of the ascertained maxima and the minima of the time-dependent voltage profile.

6. The method as claimed in claim 1, wherein the identifying of the potential to which the shorted excitation line can be pulled is effected by virtue of the offset value of the time-dependent voltage profile of the shorted excitation line being compared with a threshold value for a ground potential and with a threshold value for an operating voltage potential.

7. A circuit for detecting a short in an excitation line of a resolver, the circuit comprising:
   a control apparatus having a processor, power stages, first connections for providing signals to excitation lines for an excitation coil of the resolver and second connections for connecting signal lines for signals of sine and cosine coils of the resolver, and first and second AD converters having inputs connected to the second connections of the control apparatus and having outputs readable by the processor for evaluation thereby;
   the excitation lines to be diagnosed that couple the first connections to the excitation coil of the resolver;
   the signal lines for the sine and cosine signals provided by the resolver, which couple the resolver to the second connections of the control apparatus;
   a third AD converter, first and second inputs of which are connected to respective ones of the first connections for the excitation lines;
   one of:
      a fourth and a fifth AD converter, each having a first input that is connected to ground and a second input that is connected to a respective one of the first connections for the excitation lines;
      and:
      two electronic switches that are respectively inserted between the connections for the excitation lines and the first and second inputs of the third AD converter, the switches being set up such that they respectively disconnect an input of the third AD converter from the corresponding excitation line and temporarily connect this input to ground; and
   a display or memory device for displaying or storing information identified by the processor that incorporates detecting of a short in one of the excitation lines of the resolver and denoting of the shorted line and a potential to which the shorted line can be pulled.

8. The circuit as claimed in claim 7, wherein the third, fourth and fifth AD converters, or the third AD converter and the two electronic switches, are integrated in the control apparatus.

* * * * *